United States Patent

Gaudet

[11] Patent Number: 6,002,717
[45] Date of Patent: Dec. 14, 1999

[54] METHOD AND APPARATUS FOR ADAPTIVE EQUALIZATION USING FEEDBACK INDICATIVE OF UNDERCOMPENSATION

[75] Inventor: Brian Gaudet, San Jose, Calif.

[73] Assignee: National Semiconductor Corporation, Santa Clara, Calif.

[21] Appl. No.: 08/864,155

[22] Filed: May 28, 1997

[51] Int. Cl.[6] .............................. H03H 7/30; H03H 7/40
[52] U.S. Cl. ..................... 375/232; 375/233; 364/724.2
[58] Field of Search ................................ 375/229, 230, 375/232, 233, 316, 346; 364/724.19, 724.2

[56] References Cited

U.S. PATENT DOCUMENTS

| | | | |
|---|---|---|---|
| 5,570,276 | 10/1996 | Cuk et al. | 363/13 |
| 5,608,400 | 3/1997 | Pellon | 341/143 |
| 5,687,101 | 11/1997 | Lee | 364/572 |
| 5,805,031 | 9/1998 | Cheng | 333/28 R |

*Primary Examiner*—Chi H. Pham
*Assistant Examiner*—Bryan Webster
*Attorney, Agent, or Firm*—Limbach & Limbach L.L.P.

[57] ABSTRACT

An adaptive equalization filter system and method [including a controllable equalization filter] which filters a signal received over a transmission link in response to feedback indicative of channel characteristics. The system uses closed loop feedback to control [the] an equalization filter to achieve cancellation of each pole of the channel transfer function with a zero of the equalization filter, by moving the zero of the filter in response to feedback indicative of the difference in transmission delay between received and equalized high and low frequency signals (e.g., high and low transition density portions of a received and equalized data signal, or received and equalized high and low frequency clocks transmitted over the channel in parallel with a data signal) until the feedback indicates equal delays for the two equalized signals. In some embodiments, phase comparison is performed on clocks recovered from high and low transition density portions of a received and equalized data signal. Preferred embodiments operate in a selected one of an amplitude based equalization mode (in which feedback is indicative of detected amplitudes of transitions in a signal received over the channel and then equalized) and a delay based equalization mode in which feedback results from phase comparison between received and equalized high and low frequency signals. Preferably, a state machine causes the system to operate initially in the amplitude based equalization mode to tune the equalization filter coarsely, and then in the delay based equalization mode (to fine tune the filter). [Other embodiments are adaptive equalization methods implemented by embodiments of the system.]

33 Claims, 3 Drawing Sheets

METHOD AND APPARATUS FOR ADAPTIVE EQUALIZATION USING FEEDBACK INDICATIVE OF UNDERCOMPENSATION

FIELD OF THE INVENTION

The present invention relates generally to methods and apparatus for adaptive equalization of data (e.g., data received over a bus or other data transmission link of a type used in local area networks). More particularly, the invention is an adaptive equalization method and apparatus which uses closed loop feedback indicative of the amount of undercompensation (or overcompensation) of the data being equalized.

DESCRIPTION OF THE RELATED ART

Equalization is a well known technique for filtering a received signal (after the signal has propagated over a transmission link) by applying different phase shifts to different frequency components of the signal to compensate for phase distortion. In general, the phase distortion undergone by the received signal depends on the characteristics of the transmission link and on the signal's frequency-amplitude spectrum.

Consider for example the phase distortion undergone by a data signal that has propagated over a twisted pair cable. The twisted pair cable has a transfer function as that of a low pass filter. Without equalization, lower frequency signals experience less phase shift during transmission through the cable than higher frequency signals. This causes phase distortion of a signal comprising multiple frequency components.

The delay versus frequency characteristic is called the group delay, and is defined as the negative of the derivative of phase versus frequency.

When delay in arrival time (of each frequency component of a received signal) is plotted against frequency (with increasing distance above the horizontal axis representing increasing delay, and increasing distance to the right of the vertical axis representing increasing frequency), the curve determines a transfer function and each local maximum of the curve (or each portion of the curve where the delay approaches infinity) is sometimes denoted as a "pole." A typical single pole transfer function (for a signal received after transmission over a link) has a pole at some positive frequency, known as the 3 db frequency, and exhibits decreasing delay with increasing frequency for all frequencies above the 3 db frequency.

When a signal having multiple frequency components has propagated through a cable having a typical (single pole, low pass) transfer function, the phases of its frequency components depend nonlinearly on frequency such that the lower frequency components undergo longer delays in the cable than do the higher frequency components.

For channels whose transfer functions have two or more poles, the delay still increases with decreasing frequency (above the 3 db frequency), but there may also be ripple in the passband (local minima/maxima in the delay versus frequency characteristic in the passband). Each transfer function typically has one pole (a local maximum) at zero frequency and another pole (local maximum) at a positive frequency close to the 3 db point. There may be ripple in passband.

The dependence of delay on frequency causes data dependent jitter ("DDJ") in a data signal, when the signal is received after propagating over a transmission link (channel). Where the signal is transmitted as a pulse, pulse spreading in the received signal occurs because the frequency components of the pulsed signal will arrive at the end of the channel at different times. These problems are compounded where the data signal is a random nrz data signal, since in this case the varying transition density causes an even wider frequency spectrum (in the sense that more of the signal's energy is spread over a wider frequency range) and thus phase distortion is even worse.

Conventionally, an equalization filter is employed to filter a received data signal (which has propagated through a channel) to address the problems of data dependent jitter in the received data signal. The equalization filter should ideally cancel each pole in the channel's amplitude transfer function with a "zero" (where each such "zero" is a local minimum in the amplitude transfer function of the equalization filter), and should ideally also cancel each "zero" (local minimum) in the channel's amplitude transfer function with a pole (local maximum) in the equalization filter's amplitude transfer function, for the frequency range of interest. For a channel whose amplitude transfer function has N poles and M zeros, the equalization filter should add N corresponding zeros and M corresponding poles to cancel the channel poles and zeros, thus giving a net phase shift of zero (i.e., equalizing the phase shifts of all frequency components of the filtered signal).

However, a non-ideal equalization filter may "overcompensate" or "undercompensate" data received over a transmission link in the following sense.

To understand overcompensation and undercompensation in the time domain, it is helpful to consider the example of a single pole channel transfer function whose pole is to be cancelled with a zero by processing a signal (which has propagated through the channel) with an equalization filter.

For a first order low pass channel transfer function (in the frequency domain) of $1/(s+p)$ the time domain response to a unit step is $1-\exp(-t/p)$, where p is the pole location in radians/sec.

For a first order equalization filter plus low pass channel with transfer function $H(s)=(s+z)/(s+p)$ where "z" is the zero of the equalization filter's transfer function and "p" is the pole of the channel transfer function, the time domain response to a step function with non-infinite edge rate is a spike with amplitude proportional to rise time of input signal, decaying back to the final value of the step.

If the pole is lower in frequency than the zero, the low pass characteristics dominate, and the channel is undercompensated. In the time domain, this results in random nrz signals with binary signaling reaching higher amplitudes at lower transition densities. This is because the signal has more time to charge to its final value. Higher transition density signals have less time to charge to their final value, and therefore are more attenuated. The attenuated signals (i.e., the higher transition density signals) have less delay (measured by zero crossing at input to channel and zero crossing at output of equalizer) than the lower transition density signals since the more attenuated signal is closer to the zero crossing, with the final value being the peak level in the other direction (not the attenuated peak level).

If the pole is higher in frequency than the zero, the channel plus equalizer transfer function is dominated by the zero, causing overshoot proportional to the edge rate of the input signal. For a higher transition density signal, the delay (measured by zero crossing at input to channel and zero crossing at output of equalizer) is more, since the signal has less time to decay from the overshoot, and is therefore further from the zero crossing on its way to its final value at the opposite peak level. For a lower transition density signal, the delay (measured by zero crossing at input to channel and zero crossing at output of equalizer) is less, since the signal has more time to decay from the overshoot, and is therefore closer to the zero crossing on its way to its final value at the opposite peak level.

Therefore, for an undercompensated system we have more delay for low transition density signals than for high transition density signals, and for an overcompensated system we have less delay for low transition density signals than for high transition density signals.

In the frequency domain, the explanation of this behavior is that an overcompensated system has negative group delay, while an overcompensated system has positive group delay.

In implementing an equalization filter, one problem is that it is difficult to create a precision active RC filter in silicon, since the manufacturing tolerances in resistance and capacitance can be as much as +/−30% (which is typically unacceptably high). The degree to which a conventional equalization filter can equalize received data (i.e., the degree to which it can reduce DDJ by equalization) depends on how well it cancels each pole of the channel transfer function with a zero, which in turn depends on the manufactured RC characteristic of the filter. If the filter overcompensates, the filtered signal still exhibits DDJ, although with a modified frequency versus delay characteristic.

Another problem in implementing a conventional equalization filter is that even with a perfectly manufactured filter (designed to filter data received over a specific type of cable), the channel transfer function's pole location depends on cable length. Therefore some way of tuning the filter for different cable lengths is needed.

In the past, this latter problem has been addressed by attempting to estimate the length of a particular cable (to which the manufactured filter has been coupled) by measuring received amplitude for signals with a certain transition density. An estimate of the cable length is then made by looking at the received amplitude at this transition density, assuming that the attenuation for various cable lengths at that frequency range is known a priori. The accuracy of this technique is limited by the accuracy of the amplitude estimate (which typically requires analog-to-digital signal conversion), and by the accuracy of a window function typically used to estimate frequency. The cable length estimation technique also requires a lot of power (e.g., due to the large number of comparators typically used for the analog-to-digital signal conversion necessary to estimate cable length).

In summary, conventional equalization filters have been subject to a number of limitations including the following. When a conventional equalization filter has been designed to filter data received over a particular transmission link (e.g., a bus having a first length), it may overcompensate or undercompensate data received over another transmission link (e.g., a bus having a length shorter than the first length), or data received over the original transmission link after a change in the channel characteristics thereof. Conventional techniques for tuning an equalization filter for use with different transmission links have been complicated and expensive to implement and have consumed much power.

There is a need for an adaptive equalization method and apparatus which eliminates the limitations and disadvantages of conventional equalization methods and apparatus.

SUMMARY OF THE INVENTION

In preferred embodiments, the invention is an adaptive equalization filter system including a simple, controllable equalization filter which filters a signal (received over a transmission link) in response to a feedback signal indicative of the characteristics of the transmission link ("channel characteristics"), but without prior knowledge of either the channel characteristics of the transmission link or the transition density or frequency-amplitude spectrum of the received signal. The system is designed to achieve cancellation of each pole of the channel transfer function with a zero of the equalization filter by controlling the equalization filter using closed loop feedback. The invention achieves this cancellation by moving a controllable zero (of the filtering function applied by the equalization filter) in response to feedback indicative of the difference between the transmission delay of a received and equalized high frequency signal (e.g., a received and equalized data signal having high transition density, or a received and equalized high frequency clock) and that of a received and equalized low frequency signal (e.g., a received and equalized data signal having low transition density, or a received and equalized low frequency clock) until the feedback signal indicates equal delays for the two equalized signals. In a first class of embodiments, high and low frequency clock signals are transmitted over the channel (in parallel with a data signal of interest) and then equalized, and phase comparison is then performed thereon. In another class of embodiments, a digital transition frequency discriminator is used to mask out decision threshold crossings (of the received and equalized signal) that do not meet a transition density criterion. The remaining threshold crossings are input to a pair of phase lock loop circuits (PLLs), so that each PLL can lock to at least some of these crossings. Two PLLs are used: one locked to crossings that occur during periods of high transition density, the other locked to crossings that occur during periods of low transition density. The recovered clocks output from these two PLLs replace the two clocks sent over the channel in the first class of embodiments. Other aspects of the invention are methods implemented by any of the embodiments of the inventive system.

The closed loop feedback circuitry (e.g., the two PLLs and transition density discriminator) can be shared among multiple ports in a multi port device, even if all ports are connected to different length cables. This is because once a link has been established for one or more of the ports, the cable length (for each port) cannot change without losing link, and when a link is lost for a port (and a new link has been established) the feedback circuitry can be used again to optimize the equalization filter for that port.

The invention achieves adaptive equalization in the sense that it cancels a pole (or poles) of a channel transfer function with no knowledge of the actual location of any of such pole. The invention effectively provides much finer tuning of an equalization filter than can prior art methods and apparatus, and with less power consumption and area overhead.

Advantages of the invention include the following. Since the adaptive equalization filter of the invention filters a data signal (received over a transmission link) in response to a feedback signal indicative of the channel characteristics of the link, the filter (under feedback control) can perform optimal equalization on the received signal (equalization without significant overcompensation or undercompensation) regardless of the channel characteristics and even if the channel characteristics for a particular link change over time. Also, the controllable equalization filter used in the invention can be a simple, inexpensive RC filter (whose capacitance varies in response to changes in the feedback signal) which can be implemented inexpensively with wide manufacturing tolerances (e.g., tolerances of +/−20%) in the resistance and capacitance values (the values of R and C). This is true since regardless of the manufactured values of R and C, the RC characteristic of the filter can be controlled to an optimal (or nearly optimal) value in response to feedback. Also, the inventive adaptive equalization filter can be implemented so as to consume little power during operation and to occupy no more than a small area of an integrated circuit.

In some preferred embodiments of the inventive system (e.g., those in which the received signal being equalized is indicative of MLT3 encoded data or other ternary data), the system operates in either of two modes: an amplitude based equalization mode (in which the feedback supplied to the equalization filter is indicative of detected amplitudes of transitions in a signal which has been received over the channel and then equalized); and a delay based equalization mode in which the feedback supplied to the equalization filter is generated as a result of phase comparison between received and equalized high and low frequency signals. Preferably, the system includes a state machine which controls operation of the system to cause the system to operate initially in the amplitude based equalization mode (to tune the equalization filter coarsely) and then in the delay based equalization mode (to accomplish fine tuning of the equalization filter).

DETAILED DESCRIPTION OF THE INVENTION

Figure 1:
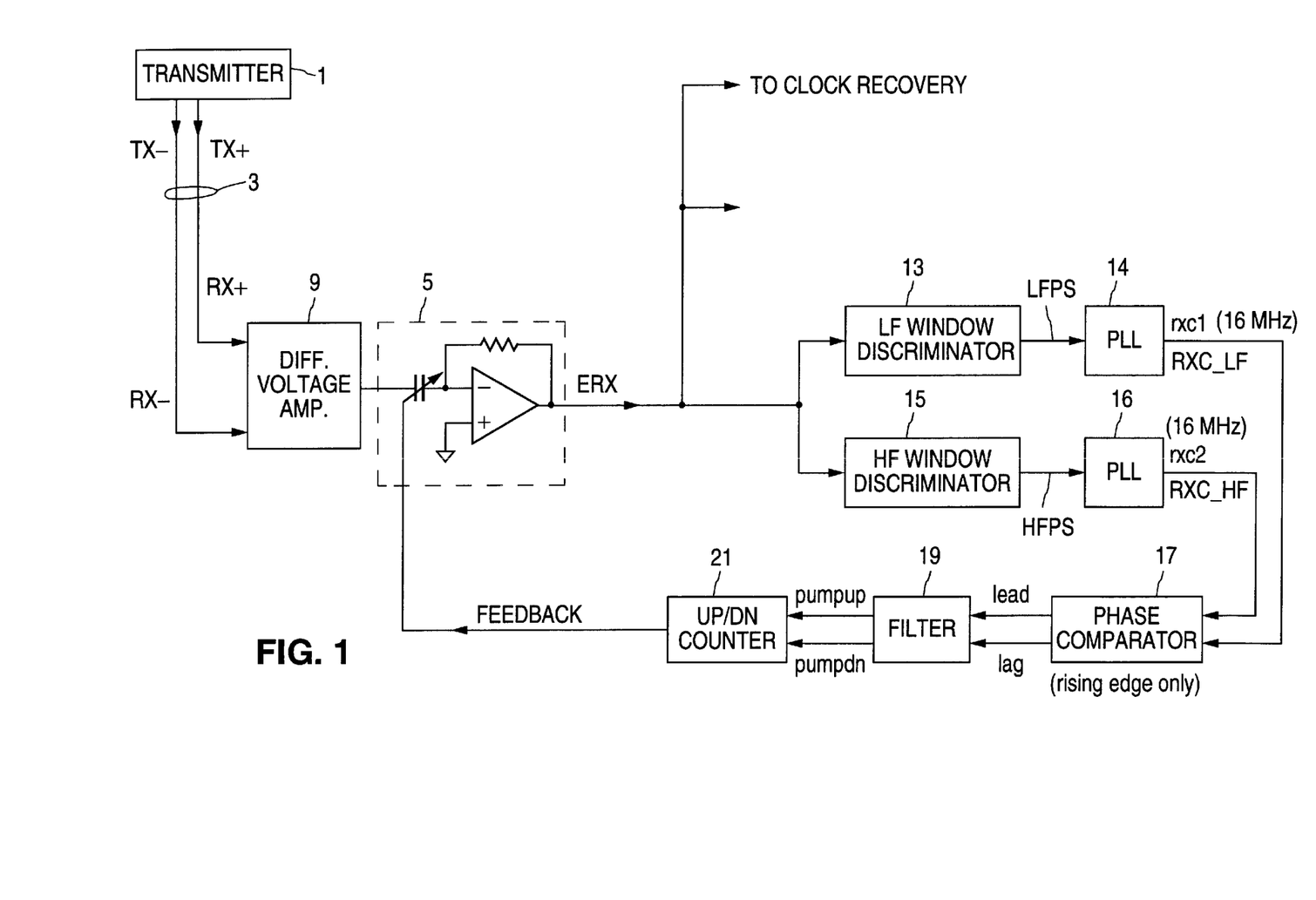
FIG. 1 is a block diagram of a first preferred embodiment of the invention.

FIG. 1 is a block diagram of a preferred embodiment of a first preferred embodiment of the invention.

Each embodiment of the invention uses a closed loop feedback system to move the zero of the filtering function applied by a controllable equalization filter (e.g., filter 5 or 7 of FIG. 1, filter 35, 36, or 37 of FIG. 2, or filter 65 or 67 of FIG. 4) in response to feedback (e.g., the feedback signal output from circuit 21 of FIG. 1 or 2 or the feedback signal output from circuit 81 or 83 of FIG. 4) indicative of the difference between the transmission delay of a received and then filtered high frequency signal (e.g., the output of phase lock loop 16 of FIG. 1, or the output of filter 37 of FIG. 2) and that of a received and then filtered low frequency signal (e.g., the output of phase lock loop 14 of FIG. 1, or the output of filter 36 of FIG. 2) until the feedback signal indicates equal delays between the two filtered signals. The feedback maintains the equalization filter's transfer function in an optimal state (within the limitations of the equalizer filter) thereby bringing the delay exhibited by filtered signals having high transition density within a desired time window of the delay exhibited by filtered signals having low transition density. Assuming a single pole channel transfer function, this maintains the equalization filter's transfer function so that it cancels a single pole of the channel transfer function with a single zero.

The invention takes advantage of the time domain behavior of the output of an undercompensated or overcompensated channel, exploiting the phenomenon that transmitted signals with high transition density exhibit an average transmission delay equal to that of a high frequency square wave, and low transition density signals exhibit an average transmission delay equal that of a low frequency square wave. The inventor has recognized that by comparing the relative phase of the equalized received signal (i.e., the output of channel plus equalizer) during periods of low and high transition density, it is possible to determine whether the equalizer is undercompensating or overcompensating. In the FIG. 1 embodiment, this is done with a frequency discriminator (circuits 13 and 15), two phase lock loop circuits (PLL circuits 14 and 16), and a phase comparator 17.

With reference to FIG. 1, transmitter 1 asserts signals TX+ and TX− to the input of twisted pair cable 3 (or to another transmission link in variations on the FIG. 1 embodiment). After propagating through cable 3 (or the other link, in one of the variations), transmitted signal TX+ is received as received voltage signal RX+ and transmitted signal TX− is received as received voltage signal RX−. Differential transconductance amplifier 9 (with feedback) converts the differential voltage pair RX+ and RX− to a single voltage signal (indicative of a stream of binary data), rejecting common mode noise. This noise rejection is critical (in typical applications), since controllable equalization filter 5 will boost high frequency noise. Amplifier 9 uses feedback to ensure unity gain. Equalization filter 5 then receives and equalizes the output of amplifier 9, to generate equalized output signal ERX (which is also indicative of a stream of binary data). It is contemplated that the elements of FIG. 1 are elements of a local area network, that transmitter 1 is part of one device connected along the network, that elements 5–21 of FIG. 1 are included in another device connected along the network, and that each transmitted signal is indicative of a stream of data.

In this specification and in the claims, the equalization filter of the invention is sometimes referred to as receiving and filtering a signal that has propagated over a transmission link. It should be appreciated that this terminology is used in a broad sense, to include both the case that the signal is equalized in the equalization filter immediately upon being received over the link and the case that the signal undergoes preliminary amplification and/or filtering (e.g., in above-described amplifier 9) upon being received and then undergoes equalization in the equalization filter.

Preferred embodiments of the invention (including the below-described preferred implementation of FIG. 1) assume that signal transmission over the network (e.g., transmission of signals TX+ and TX−) complies with the conventional local area network specification known as the "100BaseT TP-PMD" standard. Preferred embodiments of the invention (including the below-described FIG. 4 embodiment) also assume that the signals transmitted over the network are indicative of data encoded in accordance with the conventional "MLT3" encoding scheme. It is contemplated that alternative embodiments of the invention can also be implemented for use in performing equalization on signals indicative of data encoded in another manner (e.g., signals indicative of Manchester-encoded binary bits), signals transmitted via bus or cable (or via wireless transmission) in accordance with a local area network protocol other than 100BaseT TP-PMD (e.g., signals transmitted over a twisted pair cable in accordance with the conventional 10BaseT or StarLAN (1BASE5) specification, signals transmitted over a double-shielded coaxial cable in accordance with the Thick Coax Ethernet (10BASE5) specification, or signals transmitted over a single-shielded coaxial cable in accordance with the Thin Coax Ethernet (10BASE2) specification), or other transmitted signals.

The feedback loop of the FIG. 1 system includes a frequency discriminator circuit which comprises elements 13 and 15. Each of low frequency window discriminator circuit 13 and high frequency window discriminator circuit 15 includes an edge detection circuit (which receives the equalized data signal ERX asserted by circuit 5) and a counter. In each of circuits 13 and 15, the edge detection circuit asynchronously detects each falling edge of the filtered data signal it receives, and asserts a pulse to the counter in response to each detected falling edge transition. These pulses reset the counter. When reset, the counter counts up at the rate of 250 MHz (and freezes when full). Circuit 13 also includes logic circuitry for asserting a low frequency window (LFW) signal, and circuit 15 also includes logic circuitry for asserting a high frequency window (HFW) signal. The LFW signal is high whenever the count value of the counter is above a threshold value (i.e., when the time elapsed since assertion of the last pulse exceeds a desired time threshold). The HFW signal is high whenever the count value of the counter is below a threshold value (i.e., while the pulses are being asserted with frequency above a desired minimum frequency threshold).

The edge detection circuit within circuit 13 also asynchronously detects each rising edge of the filtered data signal it receives, and asserts a "rising edge" pulse to the logic circuitry in circuit 13 in response to each detected rising edge transition. Similarly, the edge detection circuit within circuit 15 also asynchronously detects each rising edge of the filtered data signal it receives, and asserts a "rising edge" pulse to the logic circuitry in circuit 15 in response to each detected rising edge transition.

In circuit 13, the LFW signal is ANDed with the stream of "rising edge" pulses generated therein, thereby creating a pulse stream (identified in FIG. 1 as "LFPS") representative of rising edges (of the filtered data signal asserted by circuit 11) which occur with low transition density (i.e., with transition density below a selected "low" threshold). In circuit 15, the HFW signal is ANDed with the stream of "rising edge" pulses generated therein, thereby creating a pulse stream (identified in FIG. 1 as "HFPS") representative of rising edges (of the filtered data signal asserted by circuit 11) which occur with high transition density (i.e., which occur with transition density above a selected "high" threshold which is typically greater than the "low" threshold).

The FIG. 1 system (and variations thereon) will work even with overlapping high and low frequency windows (in the sense that the "high" threshold mentioned in the previous paragraph is lower than the "low" threshold) as long as the high and low frequency windows do not completely overlap. Best performance is gained by having the low frequency window extend from DC (zero frequency) to just high enough to include enough transition density in the pulse train output from circuit 13 to keep PLL 14 in lock, and by having the high frequency window extend from 62.5 MHz downward just enough to get enough transition density in the pulse train output from circuit 15 to keep PLL 16 in lock. Of course, in practice, some margin in the width of each window is desirable.

Note that the passing (by circuit 13 or 15) of pulses indicative of rising edges of the equalized data signal ERX in no way changes the phase associated with these rising edge transitions. Rather, circuits 13 and 15 qualify rising edge transitions based on how long it has been since the preceding falling edge transition.

The HFPS pulse stream has rising edge transitions that have same phase as binary NRZ signals that meet the HF discriminator window requirements (high transition density), and the LFPS pulse stream has rising edge transitions that have same phase as binary NRZ signals that meet the LF signal requirements (low transition density).

To create a combined channel/equalizer characteristic that minimizes delay variation with frequency, the FIG. 1 system uses phase lock loop (PLL) circuit 14 to extract a clock from the LFPS pulse stream and phase lock loop (PLL) circuit 16 to extract a clock from the HFPS pulse stream. PLL 14 locks to the LFPS pulse stream. PLL 16 locks to the HFPS pulse stream. It should be recognized that each of PLL 14 and PLL 16 can readily lock to its input signal for the following reasons. The range of time delays between successive rising edges of the input signal to PLL 14 (and to PLL 16) is much smaller than the range between successive rising edges of the data stream asserted to circuits 13 and 15 from circuit 5 (if the LF and HF windows determined by circuits 13 and 15 are appropriately chosen). Although the data stream asserted to circuits 13 and 15 from circuit 5 typically has extreme phase distortion, the phase distortion is small for pulses (of such data stream) that are separated by delays corresponding to frequencies within a narrow frequency range (such as the frequency range for which each of circuits 13 and 15 should be designed to select). Also, each of PLL 14 and PLL 16 preferably locks only to rising edges of the input signal it receives (so that it need recover a clock having only half the maximum frequency that would need to be recovered if it were to lock to both rising and falling edges of the input signal).

PLL 14 and PLL 16 can be implemented in the same way as are conventional 10 MHz/100 MHz clock/data recovery PLL circuits, except that they need to perform phase compares only on rising edges and to do binary phase error quantization.

The recovered clock from PLL 14 (identified as "RXC_LF" in FIG. 1) has a phase, with respect to that of a corresponding rising edge of data signal RX+ (or RX−) prior to transmission over cable 3, which is the average of the delays encountered by a first subset of the pulses of the data signal, where each pair of successive ones of the pulses in the first subset is separated by a time corresponding to a frequency in the frequency range of the LF window determined by circuit 13. The recovered clock from PLL 16 (identified as "RXC_HF" in FIG. 1) has a phase, with respect to that of a corresponding rising edge of data signal RX+ (or RX−) prior to transmission over cable 3, which is the average of the delays encountered by a second subset of the pulses of the data signal, where each pair of successive ones of the pulses in the second subset is separated by a time corresponding to a frequency in the frequency range of the HF window determined by circuit 15. Since white noise is constant over the frequency range of interest, gaussian jitter will have the same effect on the phase of both clocks, and since both PLL 14 and PLL 16 look at rising edges of data, DCD will have same effect for both clocks. Therefore the phase difference between clock RXC_LF and clock RXC_HF is proportional to the phase distortion of the channel. If the channel were distortionless, clock RXC_LF should on average be in phase with clock RXC_HF. If the phase distortion is that of a low pass filter, clock RXC_LF will lag clock RXC_HF. If equalizer 5 is overcompensating, then the overall phase distortion is that of a high pass filter, and clock RXC_LF will lead clock RXC_HF.

Clocks RXC_LF and RXC_HF are the inputs to phase comparator 17 as shown in FIG. 1. The leading and lagging outputs of phase comparator 17 are asserted to digital filter 19 with proportional control. The two outputs of filter 19 are used to adjust the zero of the transfer function of equalizer 5. If clock RXC_LF lags clock RXC_HF (in the case of undercompensation) for N consecutive phase compares, the outputs of filter 19 cause up/down counter 21 to change the feedback signal (which counter 21 asserts to equalizer 5) to cause equalizer 5 to move the zero of its transfer function lower in frequency. If clock RXC_LF leads RXC_HF (in the case of overcompensation) for N consecutive phase compares, the outputs of filter 19 cause up/down counter 21 to change the feedback signal (which counter 21 asserts to equalizer 5) to cause equalizer 5 to move the zero of its transfer function higher in frequency.

The end result is that the feedback signal controls equalizer 5 to maintain the zero of its transfer function at a frequency placed to minimize the phase difference between RXC_LF and RXC_HF. This has the same effect as minimizing the phase distortion between high and low frequency signals passing through the channel (i.e., propagating through cable 3).

In one embodiment, equalizer filter 5 consists of an op-amp in inverting configuration with a resistor (R) in the feedback path, with the op amp's noninverting input connected to ground (or another reference potential), and with a variable capacitance (C) connected between the output of amplifier 9 and the op amp's inverting input. The variable capacitance is implemented as a set of binary weighted capacitors (e.g., eight binary weighted capacitors), any number of which can be connected in parallel (between the output of amplifier 9 and the op amp's inverting input) by CMOS switches or left floating by the CMOS switches (the state of each CMOS switch is determined by the "Feedback" signal asserted to filter 5 by up/down counter 21). The value of R is chosen and the value of C is controlled to give the equalizer's transfer function an adjustable zero at a frequency in the range from 1 MHz to 62.5 MHz (with a pole that will be a factor of 50 above the zero). The purpose of the pole is for stability since a perfect differentiator would pass much noise with high gain. The pole will always be above the frequency range of interest.

However, in a preferred embodiment (e.g., the embodiment to be described below with reference to FIG. 4) equalization filter 5 is replaced by an transconductance equalization filter, such as that shown in FIG. 3. The FIG. 3 circuit includes first transconductance amplifier 50, second transconductance amplifier 51, and capacitor 52. The noninverting input of first transconductance amplifier 50 is connected to the output of amplifier 9 (to receive the output voltage signal Vi asserted by amplifier 9), its inverting input is grounded, and its output asserts an equalized data signal (which can be supplied to LF and HF window discriminator circuits 13 and 15). The output of first transconductance amplifier 50 is also connected to the inverting input of second transconductance amplifier 51. The noninverting input of transconductance amplifier 51 is connected to ground. Capacitor 52 (having capacitance C1) is connected between the output of transconductance amplifier 51 and the noninverting input of transconductance amplifier 50.

Transconductance amplifier 50 asserts a voltage (having magnitude $(V_+-V_-)(g_{m1})$, where $V_+-V_-$ is the potential difference between amplifier 50's inputs) at its output.

Transconductance amplifier 51 asserts a voltage (having magnitude $(V_+-V_-)(g_{m2})$, where $V_+-V_-$ is the potential difference between amplifier 51's inputs) at its output. The transfer function of the FIG. 3 circuit (in the frequency domain) is $Vo(s)/Vi(s)=[(s)(C1)+g_{m1}]/[(s)(C1)+g_{m2}]$, where "s" represents frequency and Vo is the equalized output voltage signal asserted at the output of amplifier 50.

Figures 2, 3:
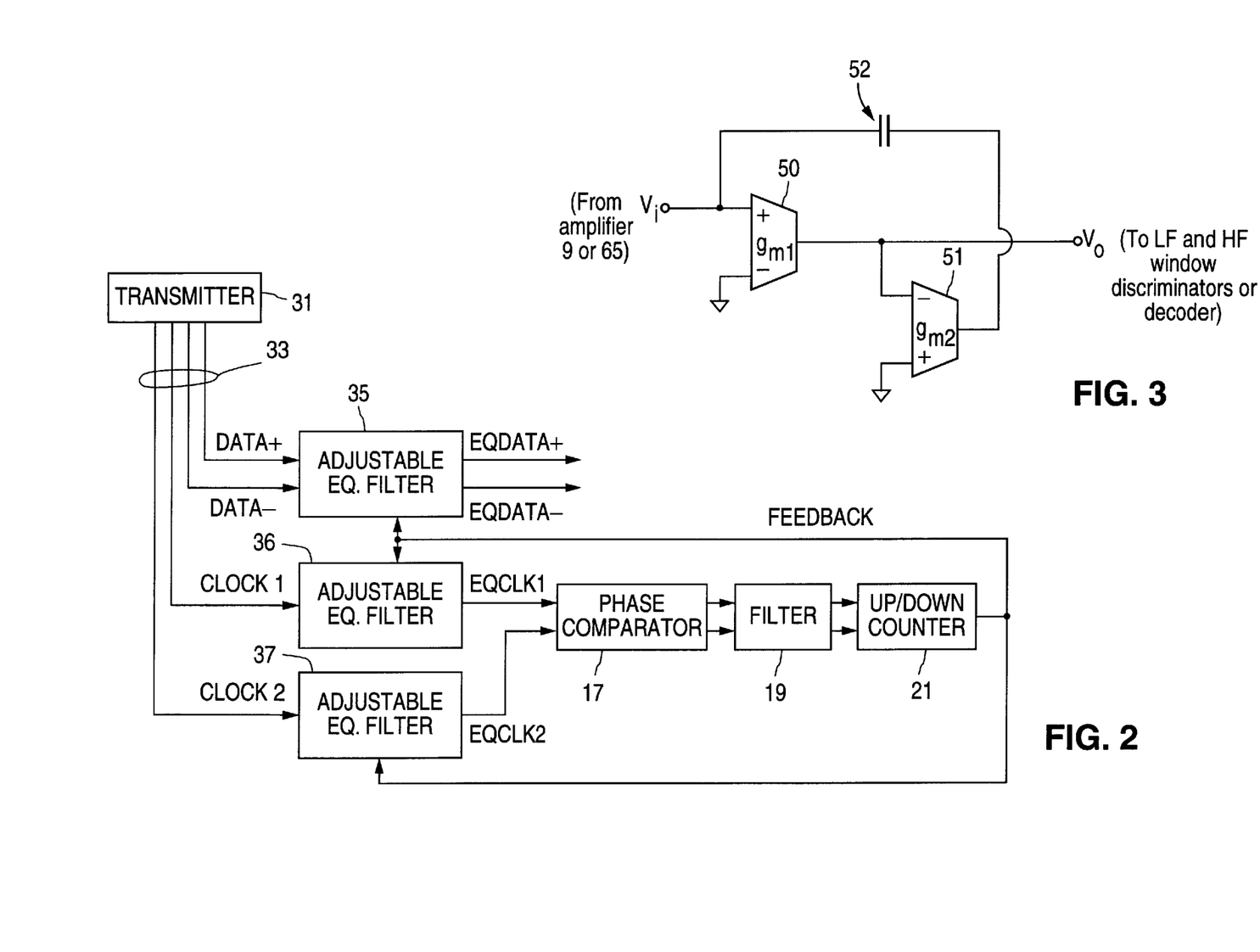
FIG. 2 is a block diagram of a second preferred embodiment of the invention.
FIG. 3 is a block diagram of a transconductance filter which can replace each of filters 5 and 7 in a variation the FIG. 1 embodiment.

In an embodiment of the invention in which filter 5 of FIG. 1 is replaced by the FIG. 3 circuit, it is contemplated that up/down counter 21 would also be replaced by a digital-to-analog converter which outputs an analog current (in response to the digital output of filter 19). This analog current would be supplied as feedback to transconductance amplifiers 50 and 51 to tune their gains ($g_{m1}$ and $g_{m2}$) to maintain optimal characteristics of the equalization filter applied to the received data signal by the FIG. 3 circuit. Since this preferred embodiment employs closed loop feedback determined by the phase comparison performed by comparator 17 (as does the FIG. 1 embodiment), the actual values of $g_{m1}$, $g_{m2}$, and C1 (and their manufacturing tolerances) are not important. What is important is that the values $g_{m1}$ and $g_{m2}$ are controllable in response to feedback in accordance with the invention.

In situations of extreme DDJ or in MLT3 applications (for equalizing MLT3 encoded data received over a transmission link), the adaptive equalization filter of the invention preferably includes circuitry which enables it to operate in an amplitude based pre-equalization mode before it commences operation in a delay based equalization mode (e.g., the above-described delay based equalization mode of FIG. 1 using PLL circuits 14 and 16 and phase comparator 17).

Figure 4:
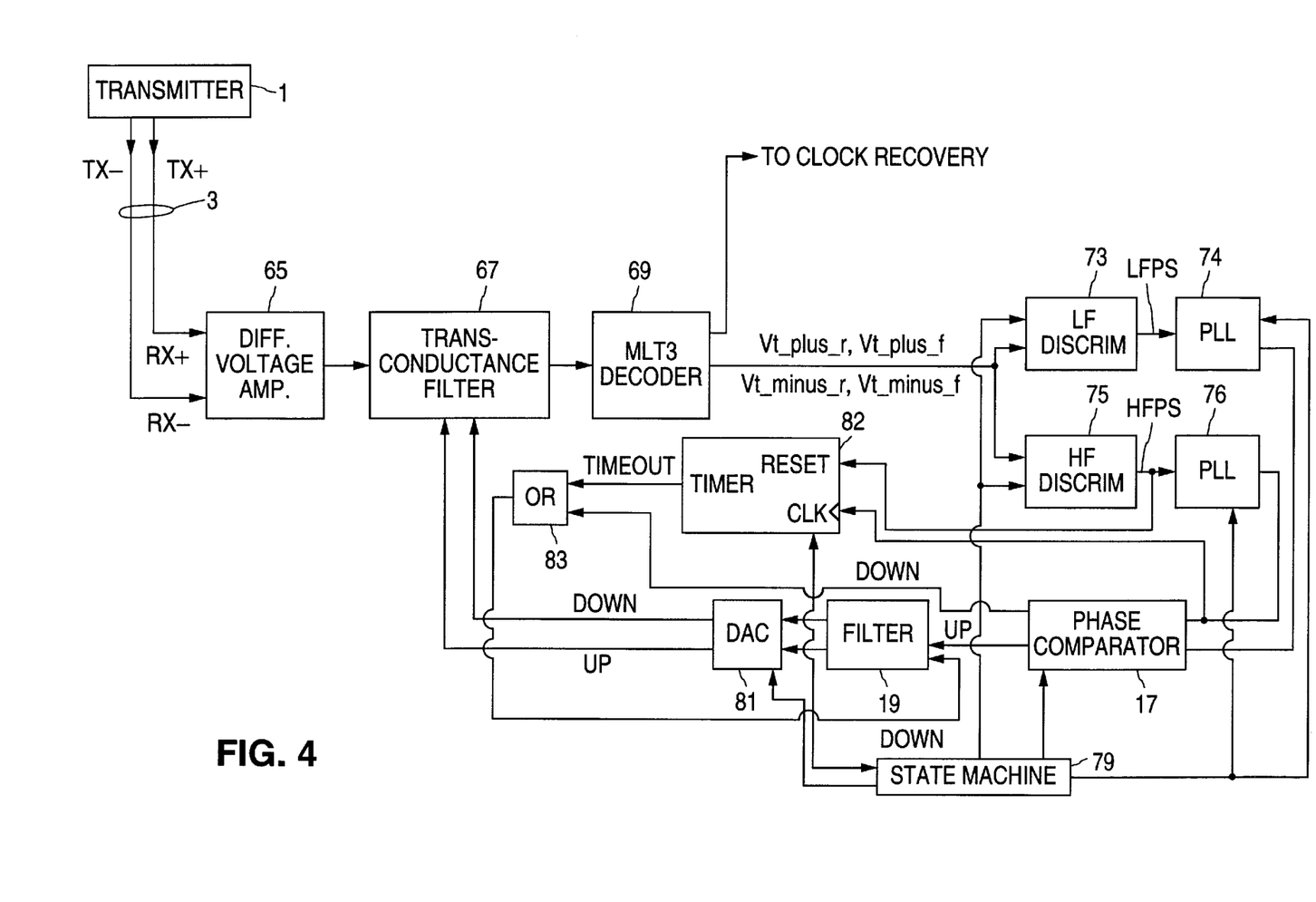
FIG. 4 is a block diagram of another preferred embodiment of the invention, including equalization filters of the transconductance type, and configured to operate in a selected one of an amplitude based equalization mode and a delay based equalization mode.

With reference to FIG. 4, we next describe a preferred embodiment of the invention for equalizing MLT3 encoded data received over a transmission link, which includes circuitry enabling it to operate in an amplitude based pre-equalization mode before it commences operation in a delay based equalization mode. The amplitude based equalization mode and delay based equalization mode will sometimes be referred to herein as an amplitude based feedback mode and a delay based feedback mode, respectively.

In preferred implementations of the FIG. 4 embodiment, signals RX+ and RX− (and TX+ and TX−) are indicative of "MLT3" encoded data, and signals TX+ and TX− are transmitted from transmitter 1 to differential voltage amplifier 65 over twisted pair cable 3 in accordance with the 100BaseT TP-PMD specification. Amplifier 65 converts the differential voltage pair (RX+ and RX−) to a single voltage, rejecting common mode noise. The voltage signal output from circuit 65 is equalized by controllable equalization filter 67. Preferably, filter 67 is a transconductance equalization filter having the structure shown in FIG. 3.

Equalization filter 67 equalizes the output of differential amplifier 65 by providing a zero and pole, with the pole 10× higher in frequency than the zero. The transfer function of filter 67 (implemented as shown in FIG. 3) is:
[s(C1)+gm1]/[s(C1)+gm2]
as discussed above with reference to FIG. 3. Therefore, both the zero and pole can be moved by adjusting a reference current to both of amplifiers 50 and 51 which will shift their gains gm1 and gm2. The amplifiers are sized such that gm2 will always be 10× greater (ten times greater) than gm1, regardless of the absolute values of gm1 or gm2. The purpose of the pole set by gm2 is to insure stability by limiting the amplifier gain at high frequencies.

The output of equalizer 65 is the input to MLT3 decoder 69, which decodes the equalizer output using two decision thresholds typically set at 0.75 Vpp and 0.25 Vpp, where Vpp is detected by a peak detector. One output of MLT3 decoder 69 is a binary NRZI encoded data stream, which is typically passed to a clock recovery module which is beyond the scope of this invention. MLT3 decoder 69 is a conventional MLT3 decoder modified to include the following additional outputs:

| Signal | Description of signal |
| --- | --- |
| Vt_plus_r | pulse stream, with each pulse asserted when positive threshold (.75$V_{pp}$) is crossed in rising direction. |
| Vt_plus_f | pulse stream, with each pulse asserted when positive threshold is crossed in falling direction. |
| Vt_minus_f | pulse stream, with each pulse asserted when negative threshold (.25$V_{pp}$) is crossed in falling direction. |
| Vt_minus_r | pulse stream, with each pulse asserted when negative threshold is crossed in rising direction. |

These four additional pulse streams are the input to the frequency discriminator circuit which comprises elements 73 and 75. Each of circuits 73 nd 75 is a pulse density discriminator comprising a counter that resets whenever a pulse is received (and otherwise counts up, freezing at full count). Two decodes are taken from this count value. One creates a signal called high density window. This signal is high if the count is below a settable threshold. The other decode creates a signal called low density window, which is high when the count is above a settable threshold. Note that these windows can be made bandpass, i.e., the high density window can be set to be high if the counter value is between two programmable thresholds. The Vt_plus_r and Vt_minus_f streams are ORed, and used to reset the discriminator timer. The Vt_plus_f and Vt_minus_r streams are ORed, and ANDed with the high density window to provide an input HFPS to PLL 76 (PLL 76 will hereafter be referred to as the HF_PLL). The Vt_plus_f and Vt_minus_r streams are ORed, and ANDed with the low density window to provide an input LFPS to PLL 74 (PLL 74 will hereafter be referred to as the LF_PLL). Input signal HFPS is a pulse stream indicative of transitions of the decoded equalized data signal occurring during periods of high transition density, and input signal LFPS is a pulse stream indicative of transitions of the decoded equalized data signal occurring during periods of low transition density.

When equalization filter 67 is controlled to undercompensate the data signals it receives, filter 67 causes those of the data signals which have lower transition density to charge up closer to final value (and causes higher transition density data signals to charge up less). Therefore it will take longer for each such lower transition density signal to discharge from peak amplitude down to the 0.75 $V_{pp}$ threshold. In contrast, a higher transition density signal would not charge up as high (as close to the peak value) and therefore would discharge faster (from the maximum amplitude to which it charges) down to the 0.75 $V_{pp}$ threshold. So filter 67 (when controlled to undercompensate received signals) has the usual characteristic (more delay for lower transition density) of an undercompensated system. When filter 67 is controlled to overcompensate received signals, a lower transition density signal will have more time to recover from the overshoot, and will therefore discharge down to the 0.75 $V_{pp}$ threshold faster than will a higher transition density signal. So filter 67 (when controlled to overcompensate received signals) has the same characteristic (more delay for higher transition density) as does filter 5 (when filter 5 is controlled to overcompensate received binary NRZ signals). Although this paragraph uses transitions (to and from positive peaks) across the 0.75 $V_{pp}$ threshold as examples, the same analysis applies to transitions (to and from negative peaks) across the 0.25 $V_{pp}$ threshold.

A signal having "lower transition density" is one for which there is a longer time (on average) between consecutive Vt_plus_r and Vt_plus_f transitions (or between consecutive Vt_minus_f and Vt_minus_r transitions or consecutive Vt_plus_f and Vt_minus_f transitions), and a signal having higher transition density is one for which there is a shorter time (on average) between such consecutive transitions.

Since the ANDing of the window with the rising edges of the pulse stream does not change the phase of the pulse stream in any way, LF_PLL has a recovered clock in phase with the average phase of rising edges of the LF pulse stream, which in turn is in phase with data of low transition density passing through the cable plant and equalizer. In addition, the recovered clock of HF_PLL will be in phase with data of high transition density passing through the cable plant and equalizer.

Recovered clocks from LF_PLL (PLL 74) and HF_PLL (PLL 76) are the inputs to phase comparator 17. This phase comparator does a phase compare at every rising edge of recovered clock from LF_PLL, comparing it to the rising edge of the recovered clock from HF_PLL. If the recovered clock from the LF_PLL lags the recovered clock from the HF_PLL, the output of comparator 17 indicates that filter 67 is undercompensating in equalization of the channel, i.e., the zero of the transfer function of filter 67 is too high in frequency, and a down pulse is sent to digital filter 19. If the recovered clock from the LF_PLL leads the recovered clock from the HF_PLL, the output of comparator 17 indicates that filter 67 is overcompensating in equalization of the channel, i.e., the zero of the transfer function of filter 67 is too low in frequency, and an up pulse is sent to digital filter 19.

Since white noise is constant over the frequency range of interest, gaussian jitter will have the same effect on the phase of both clocks (both recovered clocks output from PLL 74 and PLL 76), and since we are only looking at rising edge of data in both PLLs, DCD will have the same effect for both. Therefore the phase difference between the recovered clock from LF_PLL and the recovered clock from HF_PLL is proportional to the phase distortion of the channel. If the channel were distortionless, then RXC_LF should on average be in phase with RXC_HF. If the phase distortion is that of a LPF, then RXC_LF will lag RXC_HF. If the equalizer is overcompensating, then the overall phase distortion is that of an HPF, and RXC_LF will lead RXC_HF.

Digital filter 19 consists of two counters. One counts down pulses, the other counts up pulses. When the counter counting down pulses reaches a programmable threshold (used to set the proportional gain of the control system), a down pulse is sent to current DAC 81. When the counter counting up pulses reaches a programmable threshold, an up pulse is sent to current DAC 81.

Current DAC 81 is an 8 bit binary weighted current DAC. An up pulse causes the current to be increased by 1 LSB step, which in turn increases gm1 and gm2 in equalizer 67, which in turn move the zero in the equalizer higher in frequency, giving less compensation. A down pulse causes the current to be decreased by 1 LSB step, which in turn decreases gm1 and gm2 in equalizer 67, which in turn move the zero in the equalizer lower in frequency, giving more compensation.

Another part of this feedback loop is timer 82. This is used for a pre-equalization phase in channels with very severe phase distortion and amplitude attenuation. The pre-equalization phase is used to ensure that outputs are available from the high density discriminator.

When equalizing MLT3 data signals, systems which implement the invention (e.g., the FIG. 4 system) desirably operate in a mode in which they perform amplitude based pre-equalization (to be described below with reference to timer circuit 82) to set the parameters of their controllable equalization filters to values appropriate for delay based equalization before they begin to operate in a mode in which they perform delay based equalization. Otherwise, when receiving data signals of very high transition density (before the equalization filters have been at least coarsely tuned to apply at least approximately adequate compensation to the signals they receive) the inadequately equalized signal received by decoder 69 will not cross either the 0.75 $V_{pp}$ or 0.25 $V_{pp}$ threshold and thus its delay information will be lost (so that delay based equalization cannot be performed to better tune the equalization filter). Thus, during operation, the FIG. 4 circuit is preferably controlled to perform an initial amplitude based equalization operation before it performs delay based equalization using the feedback loop comprising circuits 73 and 75, PLLs 74 and 76, and comparator 17. As long as the equalization filter is set (during amplitude based equalization) so that the lowest amplitude signals (the ones with highest transition density) will have amplitudes which cross the two thresholds during delay based equalization, the feedback loop comprising circuits 73 and 75, PLLs 74 and 76, and comparator 17 will operate as intended during delay based equalization.

As noted above, timer circuit 82 of FIG. 4 is used to implement the above-mentioned amplitude based equalization mode (sometimes referred to herein as the "pre-equalization" mode). The FIG. 4 circuit typically operates in the pre-equalization mode before it is controlled to commence operation in the above-described delay based equalization mode (in which PLL circuits 74 and 76 extract clock signals from the outputs of circuits 73 and 75 and phase comparator 17 compares the phases of extracted clock signals). Circuit 75 operates in the same manner in both the amplitude based equalization mode and the delay based equalization mode. Circuit 82 is reset by each pulse output from circuit 75 during the amplitude based equalization mode.

Timer 82 has a timeout decode such that with a pseudo random data sequence of the type specified for 100BT, a transition passing the high density discriminator window would be guaranteed to occur before the timeout decode, provided the channel was at least grossly compensated for by equalizer 67. If the timeout decode is reached, it will cause a down pulse to be generated, which is ORed (in OR gate 83) with the down pulse stream from digital filter 19. This will cause the zero (of the transfer function of the equalization filter applied by filter 67) to move lower in frequency until high transition density signals are able to pass the MLT3 decoder min and max thresholds, which in turn will allow creation of the HF pulse stream, allowing delay based equalization to start.

State machine 79 is a simple state machine which controls the operating mode sequence of the FIG. 4 system. To initiate the amplitude based equalization mode, state machine 79 controls circuits 81 and 82 to set the zero of the equalization filter above 100 MHz. Then, during amplitude based equalization, while filter 67 receives data from circuit 9, state machine 79 causes PLL circuit 76 to assert a clock to circuit 82 and causes circuit 75 to operate as noted above. Circuit 75 asserts output pulses to timer circuit 82 in response to the equalized filtered data it receives, and timer 82 asserts output signal "TIMEOUT" with a high logical level to "OR gate" 83 when timer 82 has counted to a threshold value without being reset (indicating that no output pulse has been asserted by circuit 75 for a minimum threshold time since timer 82 has been reset). In response to the signal TIMEOUT, gate 83 asserts a control signal (DOWN') to filter 19, which in turn causes DAC 81 to assert a control signal to equalization filter 67 causing the zero of the equalization filter to move down in frequency by one predetermined step. This process iterates until circuit 75 begins to detect transitions sufficiently often to prevent timer 82 from asserting the TIMEOUT signal (which indicates that the zero of the equalization filter applied by circuits 75 and 67 has been coarsely tuned to a value enabling generation of feedback during delay based equalization). At this stage, state machine 79 asserts control signals to initiate the delay based equalization mode of the system (to fine tune the equalization filter "zero" location). As of the end of the amplitude based equalization operation, DDJ in the equalized data signal output from circuit 71 should be low enough to be a reasonable fraction of the jitter window (which is 16 nanoseconds in a typical implementation). It is expected that the described amplitude based equalization will accomplish equalization as well as prior art equalizers can do (and probably better since it is not subject to quantization error).

An effect of performing delay based equalization with a threshold set by using peak voltage swings, and still having some signals with lower swings, is to make higher transition density signals seem to have even less delay with respect to low transition density signals. This is because the threshold is closer to the lower amplitude signal peaks. This does not inhibit delay based equalization feedback loop operation however, as long as at least some signals passing through the high frequency window reach threshold. This is the reason for the described amplitude based pre-equalization process. Amplitude based pre-equalization is usually not needed with binary signaling (as in the FIG. 1 embodiment) since the invention can then use zero crossing as the threshold for edge detection, which guarantees that all signals of amplitudes will cross (except in very undercompensated systems).

If the channel transfer function is known to have more than one pole, and perhaps more than one zero, and the relative location of these poles and zeros is relatively constant, but their absolute location varies with the characteristics of the channel (e.g., the length of cable 3), then the invention can be employed to create a compensating equalization filter to cancel these poles and zeros. In such embodiments of the invention, the equalization filter's poles and zeros would be moved in from high frequency keeping frequency spacing of poles and zeros constant, until the feedback loop finds the optimal absolute frequency for the pole/zero combination to minimize DDJ.

If the relative location of the poles and zeros of the channel transfer function also vary significantly with the characteristics of the channel (e.g., the length of cable 3), then equalization of multiple poles and zeros becomes more complicated. In the case that the equalization filter must have two zeros to cancel two poles of the channel transfer function, the invention is implemented to have both zeros of the equalization filter start out at the same frequency, above the frequency range of interest. As the feedback loop detects undercompensation, both zeros are moved together lower in frequency until the loop stabilizes. It would now be necessary to use a third PLL circuit to lock to a window centered at approximately the location of the two zeros, and to start moving the zeros apart until the third PLL is locked to the low frequency clock recovered from the pulses asserted by the LFW discriminator, and both the first and second PLLs (the LFW PLL and HFW PLL) are in lock.

In the case of channel transfer functions having more poles and zeros, it is expected that the invention can also be implemented. The best approach to do so may be either to perform delay based equalization as well as possible keeping the relative location of the equalization filter's cancellation poles and zeros constant. Alternatively, it may be better to use amplitude based equalization only in such cases.

For data protocols using binary rather than MLT3 encoding, MLT3 decoder 69 (of FIG. 4) can be replaced by a zero crossing detector. In this case, the HF pulse stream is created by edge detecting zero crossings and ANDing them with the high density window, while the LF pulse stream is created by edge detecting zero crossings and ANDing them with the low density window.

Next with reference to FIG. 2, we describe an another class of embodiments of the invention in which delay based feedback is generated without employing PLL circuits to recover high and low frequency clocks from the data signals undergoing equalization.

FIG. 2 is a block diagram of a second preferred embodiment of the invention, which differs from the FIG. 1 embodiment primarily in that high and low frequency clock signals are received from the transmitted in parallel with the data signals to be equalized, so that high and low frequency window discrimination circuits and PLL circuits are not needed to extract such clock signals from the received data signals. Several components of the FIG. 2 system are identical to corresponding components of the FIG. 1 system. These components are identically numbered in FIGS. 1 and 2, and the foregoing description of them (with reference to FIG. 1) will not be repeated with reference to FIG. 2.

In the FIG. 2 system, transmitter 31 asserts data signals DATA+ and DATA−, low frequency clock signal CLOCK1, and high frequency clock signal CLOCK2 to the input of transmission link 22, so that all four signals DATA+, DATA−, CLOCK1, and CLOCK2 propagate in parallel over link 33 to equalization filters 35, 36, and 37. DATA+ and DATA− are complementary voltage signals as are signals RX+ and RX− in FIG. 1.

Equalization filter 35 is a controllable equalization filter which can be identical to circuit 5 described above with reference to FIG. 1. Filter receives and equalizes signal DATA+ (after DATA+ has propagated over link 33) to generate equalized signal EQDATA+, and filter 35 receives and equalizes signal DATA− (after DATA− has propagated over link 33) to generate equalized signal EQDATA−. Typically, one of the equalized signals EQDATA+ and EQDATA− output from circuit 35 is later subtracted from the other (by circuitry not shown in FIG. 2) to generate a stream of binary data (as equalized signal ERX− is subtracted from ERX+ in the FIG. 1 system to generate a stream of binary data).

Transmission link 33 is a bus or other link having capacity to send separate clock signals CLOCK1 and CLOCK2 in parallel with each data signal to be equalized. It is contemplated that link 33 is a ribbon cable, each of DATA+ and DATA− has a maximum data rate of 25 MHz, CLOCK1 has frequency 2.5 MHz, and CLOCK2 has frequency 25 MHz in preferred embodiments, but the FIG. 2 embodiment of the invention can be implemented using another transmission link or using transmitted data (and clocks) having other characteristics.

Each of equalization filters 36 and 37 is a controllable equalization filter which can be identical to circuit 5 described above with reference to FIG. 1. Filters 35, 36, and 37 are controlled to apply the same filter to the signals they receive. Filter 36 receives and equalizes signal CLOCK1 (after CLOCK1 has propagated over link 33), and filter 37 receives and equalizes signal CLOCK2 (after CLOCK2 has propagated over link 33).

In response to every rising edge (or every falling edge) of the equalized low frequency clock EQCLK1 asserted from filter 36, phase comparator 17 asserts outputs which indicate whether the phase of the signal EQCLK2 asserted from filter 37 leads or lags that of signal EQCLK1. The leading and lagging outputs of comparator 17 are asserted to digital filter 19 with proportional control. The two outputs of filter 19 are used to adjust the zero of the transfer function of each equalizers 35, 36, and 37. If clock EQCLK1 lags clock EQCLK2 (in the case of undercompensation) for N consecutive phase compares, the outputs of filter 19 cause up/down counter 21 to change the feedback signal (which counter 21 asserts to equalizers 35, 36, and 37) to cause each of equalizers 35, 36, and 37 to move the zero of its transfer function lower in frequency. If clock EQCLK1 leads clock EQCLK2 (in the case of overcompensation) for N consecutive phase compares, the outputs of filter 19 cause up/down counter 21 to change the feedback signal (which counter 21 asserts to equalizers 35, 36, and 37) to cause each of equalizers 35, 36, and 37 to move the zero of its transfer function higher in frequency.

The FIG. 2 embodiment can be modified in a manner that will be apparent to those of ordinary skill in the art (given the description above of the FIG. 4 embodiment) for use in equalizing ternary data (e.g., MLT3 encoded data) transmitted over a transmission link (e.g., a bus) in parallel with high and low frequency clock signals.

As noted above with reference to FIG. 4, circuits 73 and 75 determine a high density window and a low density window, and these windows can be made bandpass. The ability to make the low and high density windows bandpass has two major uses in optimizing the inventive feedback system. The first is for the case of severe DDJ. If the peak DDJ is such that it spans more than the time from rising edge to rising edge of the HF pulse stream asserted to PLL 76, we have no "eye" and PLL 76 will not lock reliably to the pulse stream. This can be fixed by having the high density discriminator window set to reject pulses that are too close together. For example, if we have a maximum transition density of 62.5 MHz (16 ns from rising edge to rising edge), and we have DDJ of 16 ns pulse to pulse, we can set the window to reject pulses within 16 ns of each other, meaning that the discriminator passes only pulses of separated by at least 32 ns rising edge to rising edge, up to the lower limit on the high frequency window. This allows the system to extract a 31.25 MHz clock from the HF pulse stream and the LF pulse stream, and have the DDJ be only 50% of the eye.

Another use of the bandpass window function is to optimize the windows for a desired amount of compensation when the loop settles. This would be useful when the channel cannot be completely equalized with a first order equalizer, it is desired to prevent the feedback loop from ending up in a state that causes overcompensation of certain frequencies, and it is desired that the feedback loop cause just enough compensation so that other methods (such as DFE) can be used to remove the remaining phase distortion.

Other aspects of the invention are adaptive equalization methods as implemented by any of the embodiments of the inventive system. One such adaptive equalization method includes the steps of:

(a) receiving a data signal which has propagated over a transmission link having a channel transfer function, said channel transfer function having a pole;

(b) equalizing the received data signal using an equalization filter having a filter transfer function to generate an equalized data signal, said filter transfer function having a zero;

(c) generating a feedback signal indicative of transmission delay difference between a high frequency signal which has propagated over the link and been equalized in a filter having the filter transfer function, and a low frequency signal which has propagated over the link and been equalized in a filter having the filter transfer function; and (d) varying the zero of the filter transfer function of the equalization filter in response to the feedback signal to improve cancellation of the pole by the zero.

Preferably, step (c) and step (d) are performed simultaneously so that both the feedback signal and filter transfer function vary with time, until the feedback signal is indicative of no significant transmission delay difference between the high frequency signal and the low frequency signal.

In some embodiments, step (c) includes the step of locking a PLL to decision threshold transitions that are passed by a high transition density discriminator and locking a second PLL to decision threshold transitions that are passed by a low transition density discriminator. The recovered clock from the first PLL will have a recovered clock of phase equal to the average of high transition density signals passing through both the channel and equalizer, while the recovered clock from the second PLL will have a recovered clock of phase equal to the average of low transition density signals passing through both the channel and equalizer. The relative phase of the two recovered clocks is used to determine whether the equalizer is overcompensating or undercompensating, which in turn will cause a feedback signal to move the zero of the equalizer in the appropriate direction.

In other embodiments, step (c) includes the step of performing phase comparison on a high frequency clock signal and a low frequency clock signal, where each of the high frequency clock signal and the high frequency clock signal has propagated over the link in parallel with the data signal and has been equalized in a filter having the filter transfer function, and the feedback signal is indicative of relative phase of the high frequency clock signal and the low frequency clock signal.

In another class of embodiments, the adaptive equalization method of the invention includes the steps of:

(a) receiving a data signal which has propagated over a transmission link having a channel transfer function, said channel transfer function having a pole;

(b) equalizing the received data signal using an equalization filter having a filter transfer function to generate an equalized data signal, said filter transfer function having a zero;

(c) generating an amplitude based feedback signal indicative of detected amplitudes of transitions in the equalized data signal;

(d) varying the zero of the filter transfer function of the equalization filter in response to the amplitude based feedback signal to achieve approximate cancellation of the pole by the zero;

(e) after step (d), generating a delay based feedback signal indicative of transmission delay difference between a high frequency signal which has propagated over the link and been equalized in a filter having the filter transfer function and a low frequency signal which has propagated over the link and been equalized in a filter having the filter transfer function; and (f) varying the zero of the filter transfer function of the equalization filter in response to the delay based feedback signal to improve cancellation of the pole by the zero.

Preferably, step (e) and step (f) are performed simultaneously so that both the delay based feedback signal and filter transfer function vary with time, until the delay based feedback signal is indicative of no significant transmission delay difference between the high frequency signal and the low frequency signal.

In other embodiments, step (e) includes the step of performing phase comparison on a high frequency clock signal and a low frequency clock signal, where each of the high frequency clock signal and the high frequency clock signal has propagated over the link in parallel with the data signal and has been equalized in a filter having the filter transfer function, and the feedback signal is indicative of relative phase of the high frequency clock signal and the low frequency clock signal.

It should be understood that various other alternatives to the embodiments of the invention described herein may be employed in practicing the invention. It is intended that the following claims define the scope of the invention and that structures and methods within the scope of these claims and their equivalents be covered thereby.

What is claimed is:

1. An adaptive equalization method, including the steps of:

(a) receiving a signal which has propagated over a transmission link having a channel transfer function, said channel transfer function having a pole;

(b) equalizing the received signal using an equalization filter having a filter transfer function to generate an equalized signal, said filter transfer function having a zero;

(c) generating a feedback signal indicative of transmission delay difference between a high frequency signal which has propagated over the link and been equalized in a filter having the filter transfer function, and a low frequency signal which has propagated over the link and been equalized in a filter having the filter transfer function; and (d) varying the zero of the filter transfer function of the equalization filter in response to the feedback signal to improve cancellation of the pole by the zero.

2. The method of claim 1, wherein step (c) is performed simultaneously with step (d) to vary the feedback signal and the filter transfer function over time, until the feedback signal is indicative of no significant transmission delay difference between the high frequency signal and the low frequency signal.

3. An adaptive equalization method, including the steps of:

(a) receiving a signal which has propagated over a transmission link having a channel transfer function, said channel transfer function having a pole;

(b) equalizing the received signal using an equalization filter having a filter transfer function to generate an equalized signal, said filter transfer function having a zero;

(c) generating a feedback signal indicative of transmission delay difference between a high frequency signal which has propagated over the link and been equalized in a filter having the filter transfer function, and a low frequency signal which has propagated over the link and been equalized in a filter having the filter transfer function; and (d) varying the zero of the filter transfer function of the equalization filter in response to the feedback signal to improve cancellation of the pole by the zero, wherein step (c) includes the step of:

performing phase comparison on a first clock signal recovered from the equalized signal during periods of high data transition density and a second clock signal recovered from the equalized signal during periods of low data transition density, wherein the feedback signal is indicative of relative phase of the first clock signal and the second clock signal.

4. The method of claim 3, wherein step (c) also includes the steps of:

producing a first discriminated signal indicative of transitions of the equalized signal that occur with frequency within a high frequency window;

asserting the first discriminated signal to a phase lock loop circuit which produces the first clock signal by locking to transitions of the first discriminated signal having frequency at least substantially equal to a selected frequency;

producing a second discriminated signal indicative of transitions of the equalized signal that occur with frequency within a low frequency window; and asserting the second discriminated signal to another phase lock loop circuit which produces the second clock signal by locking to transitions of the second discriminated signal having frequency at least substantially equal to the selected frequency.

5. An adaptive equalization method, including the steps of:

(a) receiving a signal which has propagated over a transmission link having a channel transfer function, said channel transfer function having a pole;

(b) equalizing the received signal using an equalization filter having a filter transfer function to generate an equalized signal, said filter transfer function having a zero;

(c) generating a feedback signal indicative of transmission delay difference between a high frequency signal which has propagated over the link and been equalized in a filter having the filter transfer function, and a low frequency signal which has propagated over the link and been equalized in a filter having the filter transfer function; and (d) varying the zero of the filter transfer function of the equalization filter in response to the feedback signal to improve cancellation of the pole by the zero, wherein step (c) includes the step of:

performing phase comparison on a high frequency clock signal and a low frequency clock signal, wherein each of the high frequency clock signal and the high frequency clock signal has propagated over the link in parallel with the signal and has been equalized in a filter having the filter transfer function, and wherein the feedback signal is indicative of relative phase of the high frequency clock signal and the low frequency clock signal.

6. The method of claim 1, wherein the equalized signal is an equalized data signal indicative of binary data.

7. An adaptive equalization method, including the steps of:

(a) receiving a data signal which has propagated over a transmission link having a channel transfer function, said channel transfer function having a pole;

(b) equalizing the received data signal using an equalization filter having a filter transfer function to generate an equalized data signal, said filter transfer function having a zero;

(c) generating an amplitude based feedback signal indicative of detected amplitudes of transitions in the equalized data signal;

(d) varying the zero of the filter transfer function of the equalization filter in response to the amplitude based feedback signal to achieve approximate cancellation of the pole by the zero;

(e) after step (d), generating a delay based feedback signal indicative of transmission delay difference, between a high frequency signal which has propagated over the link and has been equalized in a filter having the filter transfer function, and a low frequency signal which has propagated over the link and been equalized in a filter having the filter transfer function; and (f) varying the zero of the filter transfer function of the equalization filter in response to the delay based feedback signal to improve cancellation of the pole by the zero.

8. The method of claim 7, wherein step (e) is performed simultaneously with step (f) to vary the delay based feedback signal and the filter transfer function over time, until the delay based feedback signal is indicative of no significant transmission delay difference between the high frequency signal and the low frequency signal.

9. The method of claim 7, wherein step (c) includes the steps of:

producing a discriminated data signal by suppressing pulses of the equalized signal that occur with frequency outside a high frequency window; and detecting amplitude transitions of the discriminated data signal whose magnitudes exceed a threshold value.

10. The method of claim 7, wherein step (e) includes the step of:

performing phase comparison on a first clock signal recovered from the equalized data signal during periods of high data transition density and a second clock signal recovered from the equalized data signal during periods of low data transition density, and wherein the feedback signal is indicative of relative phase of the first clock signal and the second clock signal.

11. The method of claim 10, wherein step (e) also includes the steps of:

suppressing transitions of the equalized signal that occur with frequency outside a high frequency window, thereby producing a first discriminated signal;

asserting the first discriminated signal to a phase lock loop circuit which produces the first clock signal by locking to transitions of the first discriminated signal having frequency at least substantially equal to a selected frequency;

suppressing transitions of the equalized data signal that occur with frequency outside a low frequency window, thereby producing a second discriminated signal; and asserting the second discriminated signal to another phase lock loop circuit which produces the second clock signal by locking to transitions of the second discriminated signal having frequency at least substantially equal to the selected frequency.

12. The method of claim 7, wherein step (e) includes the step of:

performing phase comparison on a high frequency clock signal and a low frequency clock signal, wherein each of the high frequency clock signal and the high frequency clock signal has propagated over the link in parallel with the data signal and has been equalized in a filter having the filter transfer function, and wherein the feedback signal is indicative of relative phase of the high frequency clock signal and the low frequency clock signal.

13. An adaptive equalization system, including:

a controllable equalization filter having a filter transfer function, wherein the equalization filter is coupled to receive a signal which has propagated over a transmission link having a channel transfer function, the equalization filter is configured to generate an equalized signal in response to the signal, the channel transfer function has a pole, and the filter transfer function has a zero; and a closed feedback loop coupled to receive the equalized signal from the equalization filter, configured to generate a feedback signal indicative of transmission delay difference between a high frequency signal which has propagated over the link and been equalized in a filter having the filter transfer function, and a low frequency signal which has propagated over the link and been equalized in a filter having the filter transfer function, and coupled to assert the feedback signal to the equalization filter, wherein the equalization filter is configured to respond to the feedback signal by varying the zero of the filter transfer function to improve cancellation of the pole by the zero.

14. The system of claim 13, wherein the equalized signal is an equalized data signal indicative of binary data.

15. An adaptive equalization system, including:

a controllable equalization filter having a filter transfer function, wherein the equalization filter is coupled to receive a signal which has propagated over a transmission link having a channel transfer function, the equalization filter is configured to generate an equalized signal in response to the signal, the channel transfer function has a pole, and the filter transfer function has a zero, and a closed feedback loop coupled to receive the equalized signal from the equalization filter, configured to generate a feedback signal indicative of transmission delay difference between a high frequency signal which has propagated over the link and been equalized in a filter having the filter transfer function, and a low frequency signal which has propagated over the link and been equalized in a filter having the filter transfer function, and coupled to assert the feedback signal to the equalization filter, wherein the equalization filter is configured to respond to the feedback signal by varying the zero of the filter transfer function to improve cancellation of the pole by the zero, wherein the closed feedback loop includes:

circuitry configured to perform phase comparison on a first clock signal recovered from the equalized signal and a second clock signal recovered from the equalized signal, wherein the feedback signal is indicative of relative phase of the first clock signal and the second clock signal.

16. An adaptive equalization system, including:

a controllable equalization filter having a filter transfer function, wherein the equalization filter is coupled to receive a signal which has propagated over a transmission link having a channel transfer function, the equalization filter is configured to generate an equalized signal in response to the signal, the channel transfer function has a pole, and the filter transfer function has a zero; and a closed feedback loop coupled to receive the equalized signal from the equalization filter, configured to generate a feedback signal indicative of transmission delay difference between a high frequency signal which has propagated over the link and been equalized in a filter having the filter transfer function, and a low frequency signal which has propagated over the link and been equalized in a filter having the filter transfer function, and coupled to assert the feedback signal to the equalization filter, wherein the equalization filter is configured to respond to the feedback signal by varying the zero of the filter transfer function to improve cancellation of the pole by the zero, wherein the closed feedback loop includes:

high frequency window discriminator circuitry coupled to receive the equalized signal and configured to produce a first discriminated signal by suppressing transitions of the equalized signal that occur with frequency outside a high frequency window;

low frequency window discriminator circuitry coupled to receive the equalized signal and configured to produce a second discriminated signal by suppressing transitions of the equalized signal that occur with frequency outside a low frequency window;

a first phase lock loop circuit coupled to receive the first discriminated signal and configured to produce a first clock signal by locking to transitions of the first discriminated signal having frequency at least substantially equal to a selected frequency;

a second phase lock loop circuit coupled to receive the second discriminated signal and configured to produce a second clock signal by locking to transitions of the second discriminated signal having frequency at least substantially equal to the selected frequency;

feedback signal generation circuitry coupled to receive the first clock signal and the second clock signal, configured to generate the feedback signal in response to the first clock signal and the second clock signal such that the feedback signal is indicative of relative phase of the first clock signal and the second clock signal, and coupled to assert the feedback signal to the equalization filter.

17. The system of claim 16, wherein the feedback signal generation circuitry includes:

a phase comparator coupled to receive the first clock signal and the second clock signal and configured to perform phase comparison thereon to generate a phase comparison signal; and additional circuitry coupled to receive the phase comparison signal, configured to generate the feedback signal in response to said phase comparison signal so that the feedback signal is indicative of relative phase of the first clock signal and the second clock signal, and coupled to assert the feedback signal to the equalization filter.

18. An adaptive equalization system, including:

a controllable equalization filter having a filter transfer function, wherein the equalization filter is coupled to receive a signal which has propagated over a transmission link having a channel transfer function, the equalization filter is configured to generate an equalized signal in response to the signal, the channel transfer function has a pole, and the filter transfer function has a zero; and a closed feedback loop coupled to receive the equalized signal from the equalization filter, configured to generate a feedback signal indicative of transmission delay difference between a high frequency signal which has propagated over the link and been equalized in a filter having the filter transfer function, and a low frequency signal which has propagated over the link and been equalized in a filter having the filter transfer function, and coupled to assert the feedback signal to the equalization filter, wherein the equalization filter is configured to respond to the feedback signal by varying the zero of the filter transfer function to improve cancellation of the pole by the zero, wherein the closed feedback loop includes:

another controllable equalization filter having said filter transfer function, wherein the additional equalization filter is coupled to receive a high frequency clock signal and a low frequency clock signal, each of the high frequency clock signal and the low frequency clock signal has propagated over the link in parallel with the signal, and the additional equalization filter is configured to generate an equalized high frequency clock signal and an equalized low frequency clock signal in response to the high frequency clock signal and the low frequency clock signal; and feedback signal generation circuitry coupled to receive the equalized high frequency clock signal and the equalized low frequency clock signal, configured to generate the feedback signal in response to the equalized high frequency clock signal and the equalized low frequency clock signal such that the feedback signal is indicative of relative phase of said equalized high frequency clock signal and said equalized low frequency clock signal, and coupled to assert the feedback signal to the equalization filter.

19. An adaptive equalization system, including:

a controllable equalization filter having a filter transfer function, wherein the equalization filter is coupled to receive a signal which has propagated over a transmission link having a channel transfer function, the equalization filter is configured to generate an equalized signal in response to the signal, the channel transfer function has a pole, and the filter transfer function has a zero, and a closed feedback loop coupled to receive the equalized signal from the equalization filter, configured to generate a feedback signal indicative of transmission delay difference between a high frequency signal which has propagated over the link and been equalized in a filter having the filter transfer function, and a low frequency signal which has propagated over the link and been equalized in a filter having the filter transfer function, and coupled to assert the feedback signal to the equalization filter, wherein the equalization filter is configured to respond to the feedback signal by varying the zero of the filter transfer function to improve cancellation of the pole by the zero, wherein the equalization filter includes a first circuit having a variable capacitance, and wherein said variable capacitance varies in response to changes in the feedback signal.

20. The system of claim 19, wherein the equalization filter includes:

an op-amp circuit having a feedback path, a resistive element in the feedback path, a noninverting input connected to a reference potential, and an inverting input connected to a first node of the first circuit, wherein a second node of the first circuit is coupled to receive the signal.

21. An adaptive equalization system, including:

a controllable equalization filter having a filter transfer function, wherein the equalization filter is coupled to receive a signal which has propagated over a transmission link having a channel transfer function, the equalization filter is configured to generate an equalized signal in response to the signal, the channel transfer function has a pole, and the filter transfer function has a zero; and a closed feedback loop coupled to receive the equalized signal from the equalization filter, configured to generate a feedback signal indicative of transmission delay difference between a high frequency signal which has propagated over the link and been equalized in a filter having the filter transfer function, and a low frequency signal which has propagated over the link and been equalized in a filter having the filter transfer function, and coupled to assert the feedback signal to the equalization filter, wherein the equalization filter is configured to respond to the feedback signal by varying the zero of the filter transfer function to improve cancellation of the pole by the zero, wherein the equalization filter includes a transconductance amplifier coupled to receive the feedback signal, said transconductance amplifier having a gain which varies in response to changes in the feedback signal.

22. An adaptive equalization system, including:

a controllable equalization filter having a filter transfer function, wherein the equalization filter is coupled to receive a signal which has propagated over a transmission link having a channel transfer function, the signal is indicative of MLT3 encoded data, the equalization filter is configured to generate an equalized signal in response to the signal, the channel transfer function has a pole, and the filter transfer function has a zero;

a closed feedback loop coupled to receive the equalized signal from the equalization filter, configured to generate a feedback signal indicative of transmission delay difference between a high frequency signal which has propagated over the link and been equalized in a filter having the filter transfer function, and a low frequency signal which has propagated over the link and been equalized in a filter having the filter transfer function, and coupled to assert the feedback signal to the equalization filter, wherein the equalization filter is configured to respond to the feedback signal by varying the zero of the filter transfer function to improve cancellation of the pole by the zero; and an MLT3 decoding circuit coupled to receive the equalized signal and configured to generate a decoded signal, a first pulse stream, a second pulse stream, a third pulse stream, and a fourth pulse stream in response to the equalized signal, wherein each pulse of the first pulse stream is asserted in response to crossing of a first threshold in a rising direction by the decoded signal, each pulse of the second pulse stream is asserted in response to crossing of the first threshold in a falling direction by the decoded signal, each pulse of the third pulse stream is asserted in response to crossing of a second threshold in the falling direction by the decoded signal, and each pulse of the fourth pulse stream is asserted in response to crossing of the second threshold in the rising direction by the decoded signal, and wherein the closed feedback loop includes:

high frequency window discriminator circuitry coupled to receive the first pulse stream, the second pulse stream, the third pulse stream, and the fourth pulse stream, and configured to assert a first discriminated signal indicative of transitions of the decoded signal that occur with frequency within a high frequency window;

low frequency window discriminator circuitry coupled to receive the first pulse stream, the second pulse stream, the third pulse stream, and the fourth pulse stream, and configured to assert a second discriminated signal indicative of transitions of the decoded signal that occur with frequency within a low frequency window;

a first phase lock loop circuit coupled to receive the first discriminated signal and configured to produce a first clock signal by locking to transitions of the first discriminated signal having frequency at least substantially equal to a selected frequency;

a second phase lock loop circuit coupled to receive the second discriminated signal and configured to produce a second clock signal by locking to transitions of the second discriminated signal having frequency at least substantially equal to the selected frequency;

feedback signal generation circuitry coupled to receive the first clock signal and the second clock signal, and configured to generate the feedback signal in response to the first clock signal and the second clock signal such that the feedback signal is indicative of relative phase of the first clock signal and the second clock signal.

23. An adaptive equalization system, including:

a controllable equalization filter having a filter transfer function, wherein the equalization filter is coupled to receive a signal which has propagated over a transmission link having a channel transfer function, the equalization filter is configured to generate an equalized signal in response to the signal, the channel transfer function has a pole, and the filter transfer function has a zero; and a closed feedback loop coupled to receive the equalized signal from the equalization filter, configured to operate in a selected one of an amplitude based feedback mode to generate a first feedback signal and a delay based feedback mode to generate a second feedback signal, and coupled to assert the first feedback signal to the equalization filter in the amplitude based feedback mode and to assert the second feedback signal to the equalization filter in the delay based feedback mode, wherein the equalization filter is configured to respond to each of the first feedback signal and the second feedback signal by varying the zero of the filter transfer function to improve cancellation of the pole by the zero.

24. The system of claim 23, wherein the second feedback signal is indicative of transmission delay difference between a high frequency signal which has propagated over the link and been equalized in a filter having the filter transfer function, and a low frequency signal which has propagated over the link and been equalized in a filter having the filter transfer function.

25. The system of claim 24, wherein the first feedback signal is indicative of detected amplitudes of transitions in the equalized data signal.

26. The system of claim 25, also including a state machine configured to cause the system to operate initially in the amplitude based feedback mode to vary the zero of the filter transfer function of the equalization filter in response to the first feedback signal to achieve approximate cancellation of the pole by the zero, and then to operate in the delay based feedback mode to vary the zero of the filter transfer function of the equalization filter in response to the second feedback signal to improve cancellation of the pole by the zero.

27. The system of claim 23, wherein the closed feedback loop includes:

circuitry configured to perform phase comparison on a first clock signal recovered from the equalized signal during periods of high data transition density and a second clock signal recovered from the equalized signal during periods of low data transition density, wherein the feedback signal is indicative of relative phase of the first clock signal and the second clock signal.

28. The system of claim 23, wherein the closed feedback loop includes:

high frequency window discriminator circuitry coupled to receive the equalized signal and configured to produce a first discriminated signal by suppressing transitions of the equalized signal that occur with frequency outside a high frequency window;

low frequency window discriminator circuitry coupled to receive the equalized signal and configured to produce a second discriminated signal by suppressing transitions of the equalized signal that occur with frequency outside a low frequency window;

a first phase lock loop circuit coupled to receive the first discriminated signal and configured to produce a first clock signal by locking to transitions of the first discriminated signal having frequency at least substantially equal to a selected frequency;

a second phase lock loop circuit coupled to receive the second discriminated signal and configured to produce a second clock signal by locking to transitions of the second discriminated signal having frequency at least substantially equal to the selected frequency; and feedback signal generation circuitry coupled to receive the first clock signal and the second clock signal, configured to generate the second feedback signal in response to the first clock signal and the second clock signal such that the second feedback signal is indicative of relative phase of the first clock signal and the second clock signal, and coupled to assert the second feedback signal to the equalization filter during the delay based feedback mode.

29. The system of claim 28, wherein the feedback signal generation circuitry includes:

a phase comparator coupled to receive the first clock signal and the second clock signal and configured to perform phase comparison thereon to generate a phase comparison signal; and additional circuitry coupled to receive the phase comparison signal, configured to generate the second feedback signal in response to said phase comparison signal so that the second feedback signal is indicative of relative phase of the first clock signal and the second clock signal, and coupled to assert the second feedback signal to the equalization filter during the delay based feedback mode.

30. The system of claim 23, wherein the equalization filter includes a first circuit having a variable capacitance, and wherein said variable capacitance varies in response to changes in the first feedback signal and in response to changes in the second feedback signal.

31. The system of claim 30, wherein the equalization filter includes:

an op-amp circuit having a feedback path, a resistive element in the feedback path, a noninverting input connected to a reference potential, and an inverting input connected to a first node of the first circuit, wherein a second node of the first circuit is coupled to receive the signal.

32. The system of claim 23, wherein the equalization filter includes a transconductance amplifier coupled to receive the first feedback signal during the amplitude based feedback mode and to receive the second feedback signal during the delay based feedback mode, said transconductance amplifier having a gain which varies in response to changes in the first feedback signal and in response to changes in the second feedback signal.

33. The system of claim 23, wherein the signal is indicative of MLT3 encoded data, and wherein the system also includes:

an MLT3 decoding circuit coupled to receive the equalized signal and configured to generate a decoded signal, a first pulse stream, a second pulse stream, a third pulse stream, and a fourth pulse stream in response to the equalized signal, wherein each pulse of the first pulse stream is asserted in response to crossing of a first threshold in a rising direction by the decoded signal, each pulse of the second pulse stream is asserted in response to crossing of the first threshold in a falling direction by the decoded signal, each pulse of the third pulse stream is asserted in response to crossing of a second threshold in the falling direction by the decoded signal, and each pulse of the fourth pulse stream is asserted in response to crossing of the second threshold in the rising direction by the decoded signal, and wherein the closed feedback loop includes:

high frequency window discriminator circuitry coupled to receive the first pulse stream, the second pulse stream, the third pulse stream, and the fourth pulse stream, and configured to assert a first discriminated signal indicative of transitions of the decoded signal that occur with frequency within a high frequency window;

low frequency window discriminator circuitry coupled to receive the first pulse stream, the second pulse stream, the third pulse stream, and the fourth pulse stream, and configured to assert a second discriminated signal indicative of transitions of the decoded signal that occur with frequency within a low frequency window;

a first phase lock loop circuit coupled to receive the first discriminated signal and configured to produce a first clock signal during the delay based feedback mode by locking to transitions of the first discriminated signal having frequency at least substantially equal to a selected frequency;

a second phase lock loop circuit coupled to receive the second discriminated signal and configured to produce a second clock signal during the delay based feedback mode by locking to transitions of the second discriminated signal having frequency at least substantially equal to the selected frequency;

feedback signal generation circuitry coupled to receive the first clock signal and the second clock signal, and configured to generate the second feedback signal during the delay based feedback mode in response to the first clock signal and the second clock signal such that the second feedback signal is indicative of relative phase of the first clock signal and the second clock signal.

* * * * *

UNITED STATES PATENT AND TRADEMARK OFFICE
CERTIFICATE OF CORRECTION

PATENT NO.: 6,002,717
DATED: December 14, 1999
INVENTOR(S): Brian Gaudet

It is certified that an error appears in the above-identified patent and that said Letters Patent is hereby corrected as shown below:

Col. 19, line 54, delete the second occurrence of "high" and replace with --low--.

Signed and Sealed this

Fifteenth Day of August, 2000

Attest:

Q. TODD DICKINSON

*Attesting Officer*    *Director of Patents and Trademarks*